United States Patent [19]
Jastrzebski

[11] Patent Number: 4,619,033
[45] Date of Patent: Oct. 28, 1986

[54] FABRICATING OF A CMOS FET WITH REDUCED LATCHUP SUSCEPTIBILITY

[75] Inventor: Lubomir L. Jastrzebski, Plainsboro, N.J.

[73] Assignee: RCA Corporation, Princeton, N.J.

[21] Appl. No.: 732,605

[22] Filed: May 10, 1985

[51] Int. Cl.[4] .......................................... H01L 21/365
[52] U.S. Cl. .................................... 29/571; 29/576 E; 29/576 W; 148/175; 148/187
[58] Field of Search ............... 29/576 W, 576 E, 571; 148/187, 175

[56] References Cited

U.S. PATENT DOCUMENTS

| | | | |
|---|---|---|---|
| 3,648,125 | 3/1972 | Peltzer | 148/187 X |
| 4,101,350 | 7/1978 | Possley et al. | 148/175 |
| 4,408,386 | 10/1983 | Takayashiki et al. | 29/576 |
| 4,412,868 | 11/1983 | Brown et al. | 148/175 X |
| 4,499,657 | 2/1985 | Ooga et al. | 29/578 |
| 4,507,158 | 3/1985 | Kamins et al. | 148/175 |

OTHER PUBLICATIONS

Trench Isolation Prospects for Application in CMOS VLSI, R. D. Rung, *IEDM Technical Digest*, Dec. 1984, pp. 574–577.
Defect Generation in Trench Isolation, C. W. Teng et al., *IEDM Technical Digest*, Dec. 1984, pp. 586–589.
A New Method for Preventing CMOS Latch-Up, K. W. Terrill et al., *IEDM Technical Digest*, Dec. 1984, pp. 406–409.
Analysis of Latchup Susceptibility in CMOS Circuits, J. E. Hall et al., *IEDM Technical Digest*, Dec. 1984, pp. 292–295.
Recent Developments in CMOS Latchup, R. R. Troutman, *IEDM Technical Digest*, Dec. 1984, pp. 296–299.
Characterization and Modeling of a Latchup-Free 1μm CMOS Technology, Y. Taur et al., *IEDM Technical Digest*, Dec. 1984, pp. 398–401.
Growth of Electronic Quality Silicon Over SiO2 by Epitaxial Lateral Overgrowth Technique, L. Jastrzebski et al., *J. Electrochem. Soc.*, vol. 129, No. 11, Nov. 1982, pp. 2645–2648.
Comparison of Different SOI Technologies: Assets and Liabilities, L. Jastrzebski, *RCA Review*, vol. 44, Jun. 1983, pp. 250–269.
Selective Epitaxial Growth for the Fabrication of CMOS Integrated Circuits, A. C. Ipri et al., *IEEE Transactions on Electron Devices*, vol. ED-31, No. 12, Dec. 1984, pp. 1741–1748.
SOI by CVD: An Overview of Material Aspects and Implications of Device Properties, L. Jastrzebski et al., *Mat. Res. Soc. Symp. Proc.*, vol. 23, 1984, pp. 417–430.
Novel Device Isolation Technology with Selective Epitaxial Growth, N. Endo et al., *IEDM Technical Digest*, Dec. 1982, pp. 241–244.

*Primary Examiner*—George T. Ozaki
*Attorney, Agent, or Firm*—Birgit E. Morris; Donald S. Cohen; Kenneth R. Glick

[57] ABSTRACT

A method for forming a CMOS FET structure includes the steps of forming an apertured insulating layer on a silicon substrate and epitaxially forming a monocrystalline silicon island of first conductivity type through an aperture therein. The exposed surface of the silicon island is then thermally oxidized and the portion of the insulating layer not covered by the oxide is removed. A monocrystalline silicon island of second conductivity type is then formed adjacent to the oxidized silicon island of first conductivity type.

7 Claims, 5 Drawing Figures

FABRICATING OF A CMOS FET WITH REDUCED LATCHUP SUSCEPTIBILITY

The present invention relates to a complementary symmetry metal oxide semiconductor (CMOS) field effect transistor (FET) structure embodied on a semiconductor substrate such as silicon. More particularly, the invention relates to a structure and fabrication method which permit a relatively high density of devices to be located on a given substrate surface area and which provide effective isolation between devices.

BACKGROUND OF THE INVENTION

A CMOS device comprises an N channel FET device and an associated and interconnected P channel FET device. It is desirable to space the N channel FET and P channel FET as closely as possible so as to increase the number of FETs which can be located in a given surface area. However, a widely recognized problem, commonly referred to as latchup, has the potential for occurring during the operation of CMOS devices that have closely spaced, i.e., a high packing density of, FETs. When CMOS devices are made in bulk semiconductor material, the N channel and P channel FETs are typically formed in a monocrystalline epitaxial layer which is disposed on a monocrystalline substrate. Such devices are typically referred to as bulk CMOS devices (as opposed to devices that are made on insulating substrates such as sapphire and which are commonly referred to as CMOS/SOS devices).

A variety of techniques have conventionally been used in an effort to reduce the susceptibility of bulk CMOS devices to latchup. These techniques include trench isolation as elaborated upon in TRENCH ISOLATION PROSPECTS FOR APPLICATION IN CMOS VLSI, R. D. Rung, *IEDM Technical Digest*, December, 1984, pp 574–577 and in U.S. Pat. No. 4,507,158, TRENCH ISOLATED TRANSISTORS IN SEMICONDUCTOR FILMS, T. I. Kamins et al., Mar. 26, 1985, and the use of heavily doped substrates or buried layers as disclosed in A NEW METHOD FOR PREVENTING CMOS LATCH-UP, K. W. Terrill et al., *IEDM Technical Digest, December,* 1984, pp 406–409. Trench isolation places a physical barrier between the N channel and P channel FETs. The use of heavily doped substrates provides a high conductivity, short minority carrier lifetime region beneath the FETs, thereby impeding the flow of minority carriers between the N channel and P channel devices.

The use of trench isolation in an epitaxial layer which is disposed on a heavily doped substrate still presents certain problems, however. When a heavily doped substrate is used, the epitaxial layer thereon is typically on the order of approximately 15 microns thick. This thickness is required in order to prevent the outdiffusion of impurities from the substrate during processing of the FETs. However, with conventional semiconductor processing techniques trenches of only 1 to 2 microns in depth are the deepest which are practicable. Deeper trenches create too large a number of crystalline defects to be acceptable. Thus, a 1 to 2 micron deep trench in a 15 micron thick epitaxial layer leaves a distance of 13 to 14 microns above the substrate/epitaxial layer interface in which latchup can occur.

As an alternative means for avoiding the aforementioned latchup problem in bulk CMOS devices, certain types of hybrid structures have been developed. These hybrid structures essentially provide a silicon-on-insulator (SOI) structure, such as silicon-on-sapphire (SOS), on the surface of a bulk semiconductor substrate. Examples of such hybrid structures may be found in COMPARISON OF DIFFERENT SOI TECHNOLOGIES: ASSETS AND LIABILITIES, L. L. Jastrzebski, *RCA Review,* June 1983, Vol. 44, pp 250–269, in U.S. patent application Ser. No. 608,544, J. F. Carboy, Jr. et al., METHOD OF GROWING MONOCRYSTALLINE SILICON THROUGH A MASK LAYER, filed May 10, 1984, now U.S. Pat. No. 4,578,142, and in the previously cited U.S. Pat. No. 4,507,158. Basically, these hybrid structures incorporate islands of an insulator such as silicon dioxide on the surface of a silicon substrate and monocrystalline silicon deposits on these insulator islands. The monocrystalline silicon deposits are isolated from the silicon substrate by the insulator islands, and the FETs which are to be isolated from each other are fabricated in the isolated silicon islands.

However, problems have also been observed with these "totally isolated" silicon island structures. One problem, termed charge pumping, is described in SOI BY CVD: AN OVERVIEW OF MATERIAL ASPECTS AND IMPLICATIONS OF DEVICE PROPERTIES, L. Jastrzebski, et al. *Mat. Res. Soc. Symp. Proc.,* Vol. 23, 1984, pp 417–430, and refers to the buildup of charge which can occur within a silicon island when the gate of the transistor therein is switched at high, e.g. nanosecond, speeds. These totally isolated structures may also prove to be uneconomical to manufacture because of the more lengthy processing associated with forming a complete epitaxial layer over the insulator layer (prior to defining the silicon islands) and because of the dimensional constraints on the insulator layer.

SUMMARY OF THE INVENTION

A method for forming a CMOS FET structure includes the steps of forming an apertured insulating layer on a silicon substrate and epitaxially forming a monocrystalline silicon island of first conductivity type through an aperture therein. The exposed surface of the silicon island is then thermally oxidized and the portion of the insulating layer not covered by the oxide is removed. A monocrystalline silicon island of second conductivity type is then formed adjacent to the oxidized silicon island of first conductivity type.

DETAILED DESCRIPTION OF PREFERRED EMBODIMENT

Figure 1:
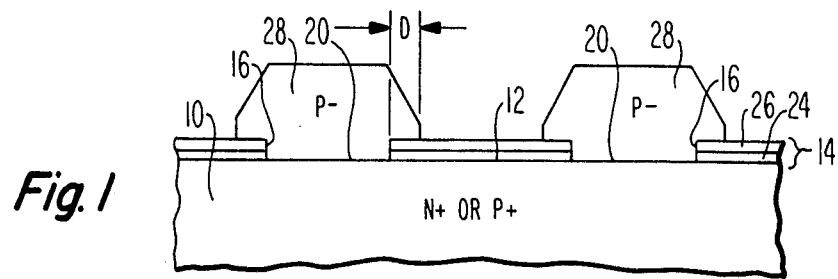
FIGS. 1 through 4 are sectional views that are illustrative of the process of the present invention in the fabrication of isolated N type and P type silicon regions for a CMOS structure.

As shown in FIG. 1, in the preferred embodiment of the present invention a heavily doped monocrystalline silicon substrate 10 of either N type or P type conductivity is provided; the term heavily doped referring to a dopant atom concentration greater than approximately $10^{19}$ cm$^{-3}$ and being designated N+ or P+. The substrate 10 has a major surface 12 on which an apertured insulating layer 14 is disposed. In the preferred embodiment there are a plurality of apertures 16 through the insulating layer 14, although, it should be recognized that only a single aperture 16 is necessary for the invention. The apertures 16 expose monocrystalline silicon nucleation sites 20 on the substrate surface 12. In the preferred embodiment the apertured insulating layer 14 is a two part structure comprising a silicon oxide layer 24 directly on the surface 12 and a silicon nitride layer 26 disposed on and coincident with the silicon dioxide layer 24. Thicknesses for the silicon dioxide layer 24 and silicon nitride layer 26 are approximately 400 Angstroms and 800 Angstroms, respectively.

Monocrystalline silicon islands 28 of first conductivity type are then formed at the nucleation sites 20 and extend vertically through the thickness of the apertures 16. The silicon of islands 28 is of relatively low conductivity, having a carrier concentration less than approximately $10^{16}$ cm$^{-3}$ and, for reasons which will subsequently be elaborated upon, is preferably of P type conductivity. In the preferred embodiment each of the silicon islands 28 also extends laterally, over the insulating layer 14, by some predetermined distance D from the aperture 16. The monocrystalline silicon islands 28 may be fabricated by the epitaxial lateral overgrowth (ELO) process as described in U.S. Pat. No. 4,578,142.

Basically, the ELO process is a two cycle deposition technique comprising a deposition stage followed by an etching stage which is performed in situ. The process results in the growth of monocrystalline silicon islands at the nucleation sites and suppresses the formation of non-single crystalline silicon on the masking layer which defines the nucleation sites. During the deposition stage of the ELO cycle the silicon which is being deposited may be appropriately doped using conventional doping materials and techniques.

Figure 2:
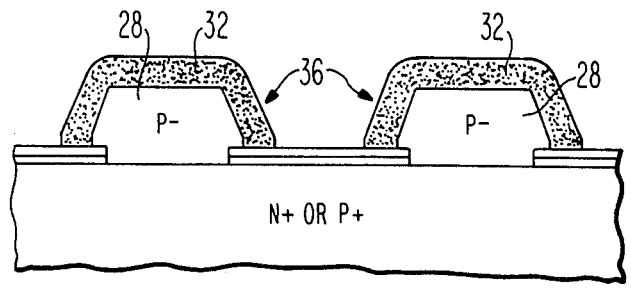

The silicon islands 28 are then oxidized such that an oxide 32 grows on the exposed surfaces thereof. In the preferred embodiment, when the islands 28 are of P type conductivity, the oxide 32 should be grown, e.g. thermally, and not deposited, e.g. by chemical vapor deposition techniques. This will yield a high quality interface between the silicon 28 and the oxide 32. The oxide 32 may be formed, for example, by exposing the structure to a temperature of 1050° C. for 1 hour in a steam ambient so as to yield approximately 1 micron of oxide. As shown in FIG. 2, the silicon islands 28 of FIG. 1 may now be referred to as oxidized silicon islands 36.

Figure 3:
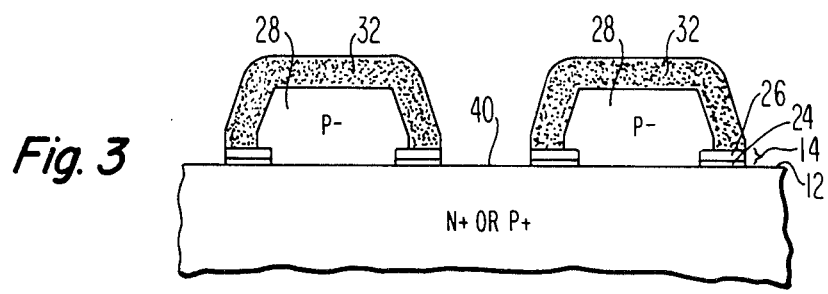

As shown in FIG. 3, that portion of the insulating layer 14 which is not covered by the oxide 32 is now removed so as to expose a second monocrystalline silicon nucleation site 40 at the substrate surface 12 adjacent to the oxidized silicon islands 36. The layers 26 and 24 of layer 14 may be removed without further masking, for example, by conventional wet chemical etching. There is no need for further masking because of the materials and thicknesses of the layers 26 and 24 being etched. For example, a 10:1:1 solution of phosphoric acid/sulfuric acid/water at approximately 155° C. may be used to selectively etch the Si$_3$N$_4$ layer 26 while not attaching oxide 32, and buffered HF may be used to completely remove the exposed 400 Å thick SiO$_2$ layer 24 while only removing a relatively small portion of the 1 micron thick oxide layer 32.

Figure 4:
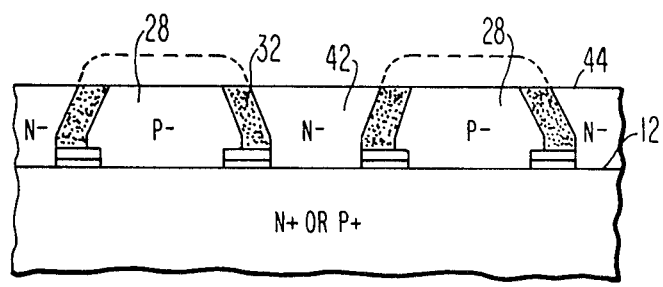

As illustrated in FIG. 4, a second silicon island 42 of second conductivity type is next formed. In the preferred embodiment the second silicon island 42 is of N type conductivity and of relatively low conductivity. The second island 42 is contiguous with the oxidized silicon islands 36 and is grown to a height from the surface 12 that is substantially equal to that of the P− type silicon islands 28. Next, that portion of the oxide 32 which lies on top of the silicon islands 28 is removed, as illustrated by the broken line in FIG. 4. The removal of this portion of the oxide 32 yields a substantially planar surface 44 which comprises the surfaces of the monocrystalline N type silicon islands 42, the monocrystalline P type silicon islands 28 and the oxide 32 disposed therebetween. The structure of FIG. 4 can then be used as the starting point for the fabrication of CMOS devices in accordance with conventional processing techniques.

Figure 5:
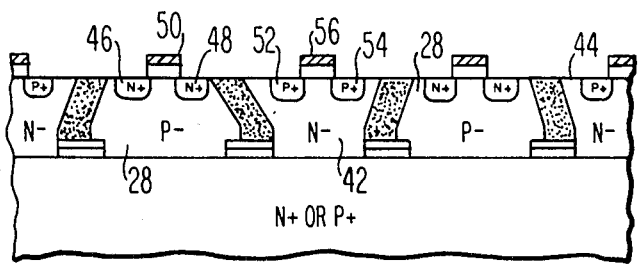
FIG. 5 is a sectional view which illustrates, in a general fashion, a CMOS device embodied in a structure fabricated in accordance with the process of the present invention.

A typical CMOS device structure which may be fabricated in the structure of FIG. 4 is illustrated in FIG. 5. A pair of spaced source and drain regions 46 and 48 of N+ type conductivity extends into the P− type island 28 from the surface 44. Overlying the spacing between these source and drain regions 46 and 48 and spaced from the surface 44 is a gate electrode 50. Similarly, in the N− type silicon island 42, P+ type source and drain regions 52 and 54 extend from the surface 44 and a gate electrode 56, spaced from the surface 44 and overlying the spacing between the regions 52 and 54, is provided.

The structure of the present invention provides significant advantages over conventional structures from the standpoint of improving packing density without sacrificing latchup protection. The N type silicon islands and P type silicon islands are effectively isolated from one another without being totally isolated. Since both the N− type silicon islands 42 and the P− type silicon islands 28 are in direct contact with the substrate 10, neither of the islands will electrically float and no charge pumping should be observed. The structure of the present invention permits the use of a heavily doped substrate with its commensurate advantages of reducing minority carrier injection, reducing the possibility of soft errors, and providing a good grounding plane.

Additionally, the structure of the present invention produces transistors having good leakage characteristics. Heretofore, when P type epitaxial silicon was formed adjacent to an oxide layer and an N channel transistor was formed therein, significant leakage occurred in the N channel transistor. The leakage of P channel transistors which were similarly formed in N type epitaxial silicon was observed to be several orders of magnitude lower. The apparent cause of the increased leakage in the N channel transistors seems to be an increased susceptibility to defects at the silicon/silicon oxide interface. In the structure of the present invention, this silicon/silicon oxide interface for the N channel FETs, i.e. for the P− type silicon islands 28, is a thermally grown, high quality oxide. Although it might be possible to achieve a high quality silicon/silicon oxide interface other than by a grown oxide, the grown oxide of the present invention provides a very convenient technique which is readily incorporated into a manufacturing process.

What is claimed is:
1. A method for forming a CMOS FET structure comprising:
   forming an apertured insulating layer on a silicon substrate;
   epitaxially forming a monocrystalline silicon island of first conductivity type through an aperture in said layer;

thermally oxidizing the exposed surface of said island so as to form an oxide thereon;

removing the portion of the insulating layer not covered by said oxide; and forming a monocrystalline silicon island of second conductivity type adjacent to said oxidized silicon island of first conductivity type.

2. A method in accordance with claim 1 wherein said first conductivity type is P and said second conductivity type is N.

3. A method in accordance with claim 1 wherein said silicon substrate is of N+ type monocrystalline material.

4. A method in accordance with claim 1 wherein said silicon substrate is of P+ type monocrystalline material.

5. A method in accordance with claim 1 futher comprising epitaxially forming said first conductivity type monocrystalline silicon islands such that said islands extend laterally over said insulating layer by a predetermined distance.

6. A method in accordance with claim 1 wherein forming said insulating layer comprises forming a layer of silicon dioxide on a surface of the substrate and forming a layer of silicon nitride on said silicon dioxide layer.

7. A method in accordance with claim 1 wherein forming said monocrystalline silicon islands of first conductivity type comprises a two stage deposition/etching cycle.

* * * * *